United States Patent
Yu et al.

(10) Patent No.: US 10,965,116 B2
(45) Date of Patent: Mar. 30, 2021

(54) OVERVOLTAGE-PROOF CIRCUIT CAPABLE OF PREVENTING DAMAGE CAUSED BY OVERVOLTAGE

(71) Applicant: REALTEK SEMICONDUCTOR CORPORATION, Hsinchu (TW)

(72) Inventors: Chia-Wei Yu, Taoyuan (TW); Hung-Chen Chu, Chiayi County (TW); Yung-Tai Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 307 days.

(21) Appl. No.: 16/100,305

(22) Filed: Aug. 10, 2018

(65) Prior Publication Data

US 2019/0097413 A1    Mar. 28, 2019

(30) Foreign Application Priority Data

Sep. 27, 2017   (TW) .................................. 106133091

(51) Int. Cl.
*H02H 3/20*   (2006.01)
*H01L 27/02*   (2006.01)

(52) U.S. Cl.
CPC ......... *H02H 3/202* (2013.01); *H01L 27/0266* (2013.01)

(58) Field of Classification Search
CPC ............................. H02H 3/202; H01L 27/0266
See application file for complete search history.

(56) References Cited

U.S. PATENT DOCUMENTS

| 10,693,450 | B2 * | 6/2020 | Nedalgi | ............. | H01L 27/0285 |
| 2015/0214723 | A1 * | 7/2015 | Aw | ........................ | H02H 3/202 |
| | | | | | 361/91.5 |
| 2017/0366004 | A1 * | 12/2017 | Nishikawa | ....... | H03K 19/00315 |

FOREIGN PATENT DOCUMENTS

TW    M500388 U    5/2015

OTHER PUBLICATIONS

Taiwan Patent Office "Office Action" dated Jul. 17, 2018, Taiwan. Summary of the OA letter: The cited reference "TW M500388 U" renders claims 7-9 anticipated.

* cited by examiner

*Primary Examiner* — Kyle J Moody
(74) *Attorney, Agent, or Firm* — WPAT, PC

(57) ABSTRACT

The present invention discloses an overvoltage-proof circuit capable of preventing damage caused by an overvoltage at moments of starting and/or stopping operation. An embodiment of the overvoltage-proof circuit includes a protected circuit and a protecting circuit. The protected circuit receives a power supply voltage to operate, and includes: a protected component, in which an upmost voltage that the protected component can withstand is lower than the power supply voltage; and at least one operational switch(es) operable to enable or disable the protected circuit according to an enabling signal. The protecting circuit is coupled to the protected component, and starts protecting the protected circuit from an overvoltage before a transition of the enabling signal, in which the overvoltage is greater than the upmost voltage.

16 Claims, 6 Drawing Sheets

OVERVOLTAGE-PROOF CIRCUIT CAPABLE OF PREVENTING DAMAGE CAUSED BY OVERVOLTAGE

BACKGROUND OF THE INVENTION

1. Field of the Invention

The present invention relates to an overvoltage-proof circuit, especially to an overvoltage-proof circuit capable of resisting an overvoltage at moments of an operation starting and/or stopping.

2. Description of Related Art

When designing a circuit (e.g., an operational amplifier or a bias circuit) suitable for an electronic device, in order to achieve better performance in a manner of lower power consumption and less circuit area, a component of low withstanding voltage and good performance will be used in a main signal path of the circuit. However, since the component has a low withstanding voltage, at moments of switching/supplying power or receiving abnormal voltage interference, the component is likely to receive a voltage higher than the withstanding voltage, and the higher voltage will reduce the component's service life or causes damage to the component. In order to prevent the above-mentioned problems, some current art equips a component of low withstanding voltage with a general overvoltage protection circuit; however, the overvoltage protection circuit will decrease the performance of a protected circuit including the component or cause problems such as electric leakage.

SUMMARY OF THE INVENTION

An object of the present invention is to provide an overvoltage-proof circuit capable of resisting an overvoltage generated at moments of an operation starting and/or stopping, and thereby protecting a component of low withstanding voltage in the overvoltage-proof circuit.

The present invention discloses an overvoltage-proof circuit capable of preventing damage caused by an overvoltage. An embodiment of the overvoltage-proof circuit includes a protected circuit and a protecting circuit. The protected circuit is configured to generate at least one output signal(s) according to at least one input signal(s) and receive a power supply voltage for operation. The protected circuit includes: a protected component configured to receive the at least one input signal(s), in which a withstanding voltage of the protected component is lower than the power supply voltage; and at least one operational switch(es) configured to enable or disable the protected circuit according to an enablement signal. The protecting circuit is coupled between a first terminal of the protected circuit and a second terminal of the protected circuit, in which the first terminal is configured to receive the at least one input signal(s). The protecting circuit starts and/or stops operating before a transition of the enablement signal according to a switch signal so as to protect the protected component from an overvoltage which is greater than the withstanding voltage of the protected component.

Another embodiment of the overvoltage-proof circuit includes a protected circuit and a protecting circuit. The protected circuit receives a power supply voltage for operation, and includes: a protected component having a withstanding voltage lower than the power supply voltage; and at least one operational switch(es) configured to enable or disable the protected circuit according to an enablement signal. The protecting circuit is coupled to the protected circuit, and operates before a transition of the enablement signal according to a switch signal so as to protect the protected component from an overvoltage which is greater than the withstanding voltage of the protected component.

In an embodiment of the present invention, the protecting circuit continuously protects the protected component in a duration of the power supply voltage being supplied regardless of whether the protected circuit is enabled or not.

In an embodiment of the present invention, the protecting circuit includes at least one protecting switch(es) configured to enable or disable the protecting circuit according to the switch signal, in which the protecting circuit is enabled before the transition of the enablement signal.

These and other objectives of the present invention will no doubt become obvious to those of ordinary skill in the art after reading the following detailed description of the exemplary embodiments that are illustrated in the various figures and drawings.

DETAILED DESCRIPTION OF THE PREFERRED EMBODIMENTS

The following description is written by referring to terms acknowledged in this industrial filed. If any term is defined in the description, such term should be explained accordingly.

The present invention discloses an overvoltage-proof circuit capable of enabling a protecting circuit in the overvoltage-proof circuit or having the protecting circuit continuously operate before a protected circuit in the overvoltage-proof circuit is enabled and/or disabled, so as to prevent an overvoltage, that is generated at moments of the protected circuit starting and/or stopping operation, from causing damage to a component of low withstanding voltage in the protected circuit.

Figure 1:
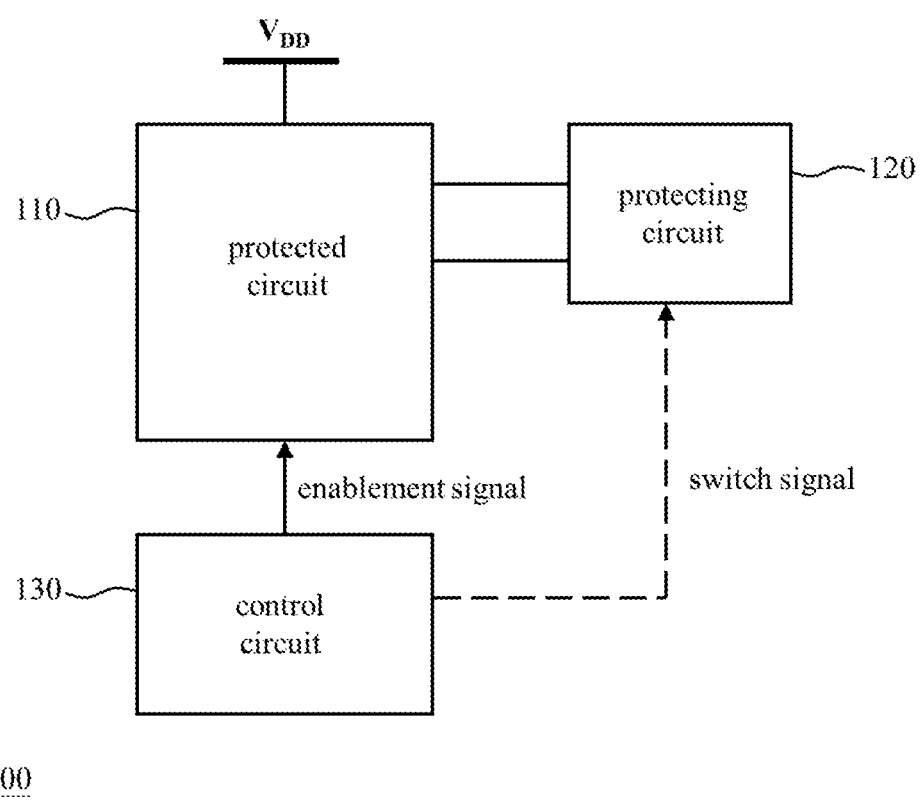
FIG. 1 shows the overvoltage-proof circuit according to an embodiment of the present invention.
Figure 2:
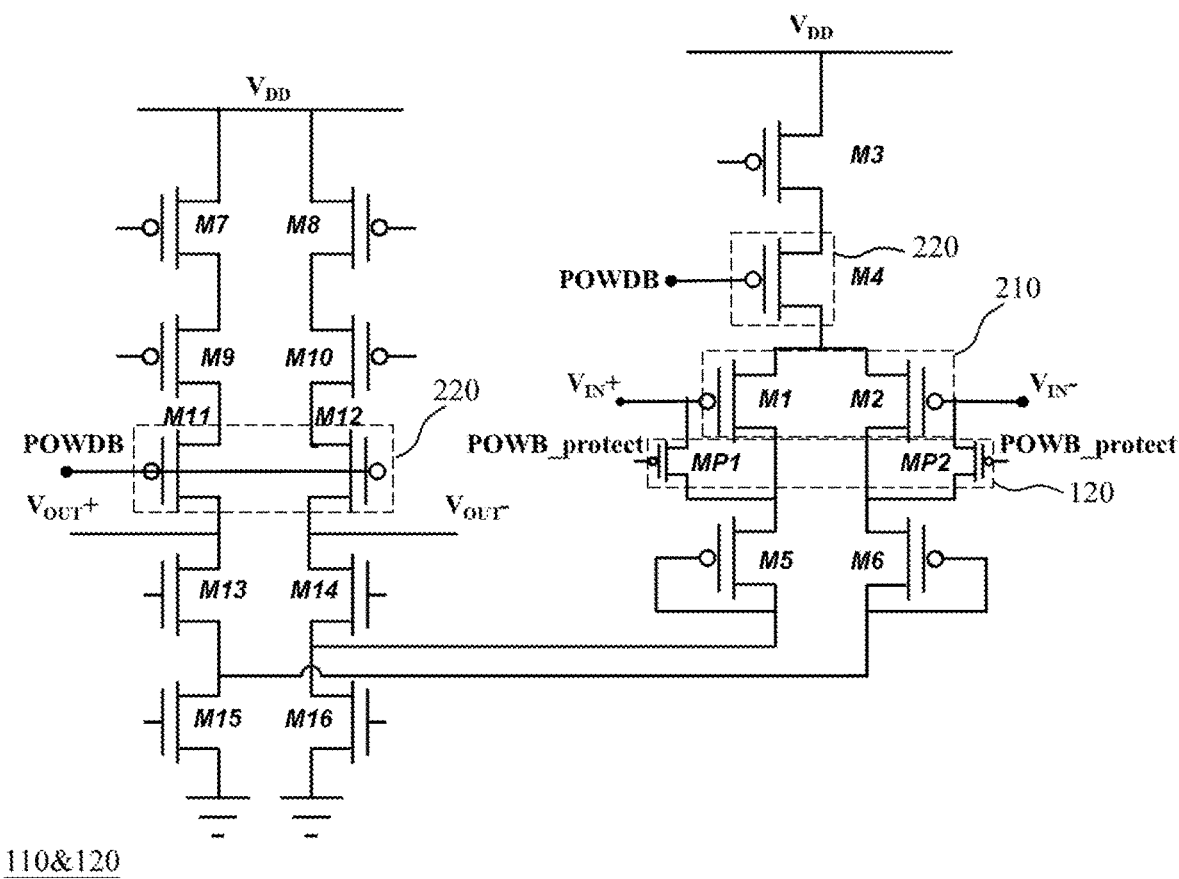
FIG. 2 shows an embodiment of the protected circuit and the protecting circuit of FIG. 1.
Figure 3:
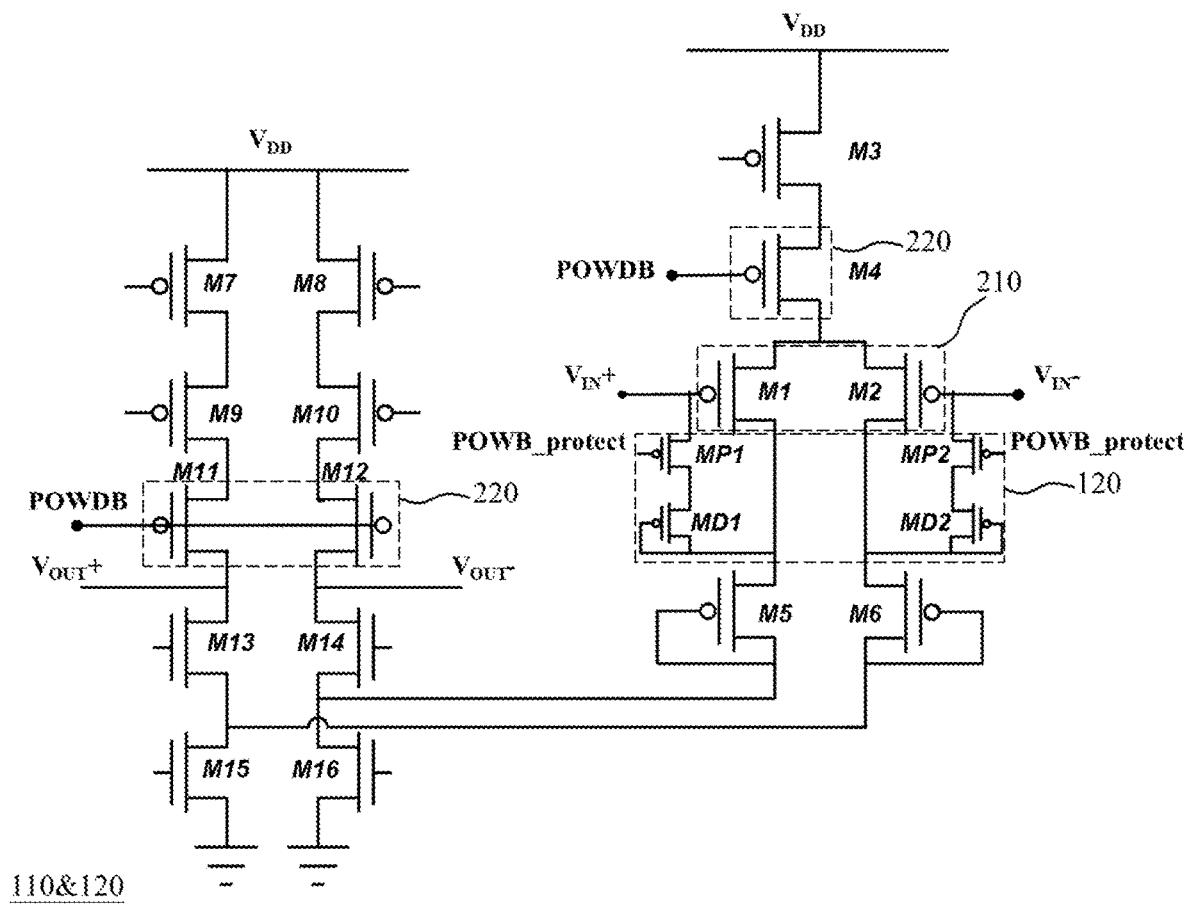
FIG. 3 shows another embodiment of the protected circuit and the protecting circuit of FIG. 1.
Figure 4:
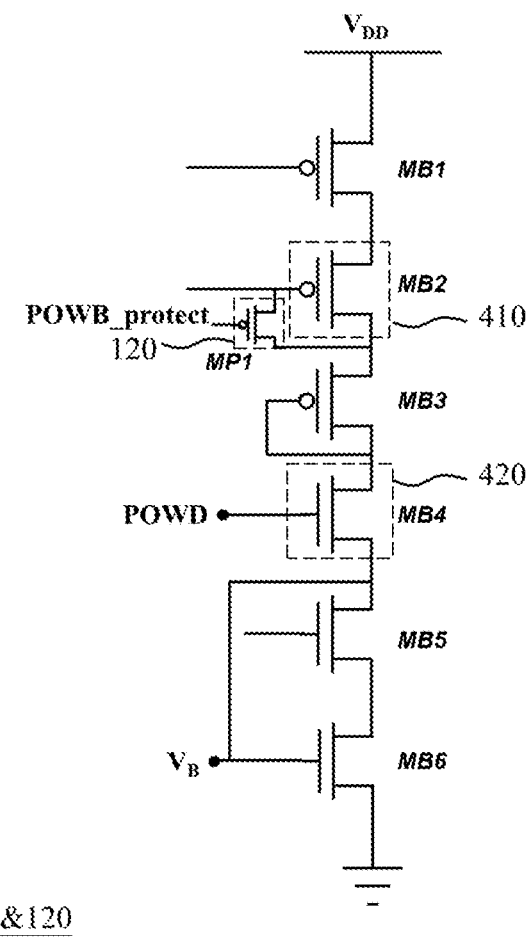
FIG. 4 shows a further embodiment of the protected circuit and the protecting circuit of FIG. 1.
Figure 5:
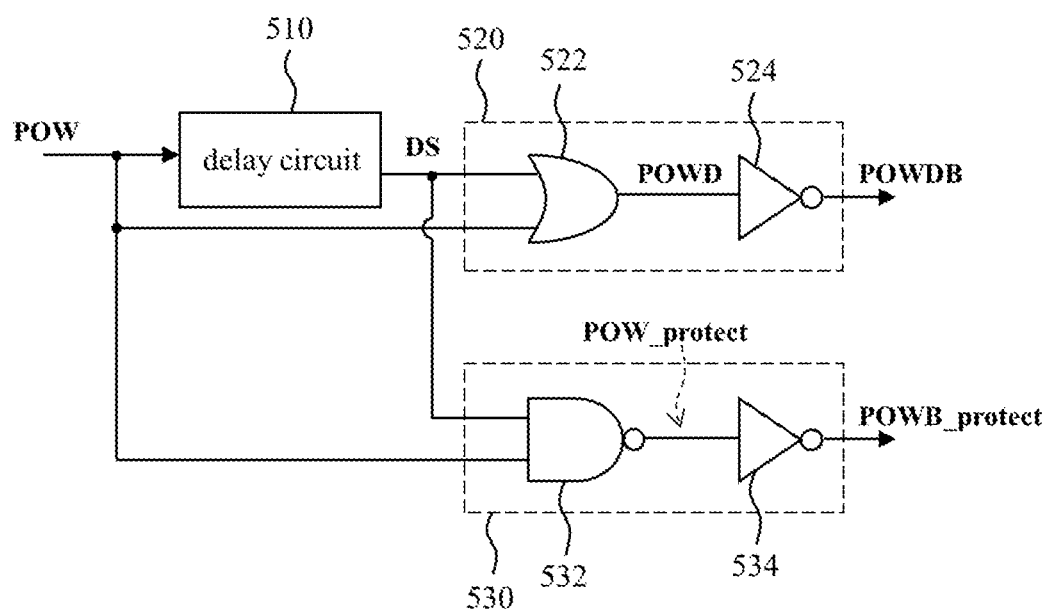
FIG. 5 shows an embodiment of the control circuit of FIG. 1.
Figure 6:
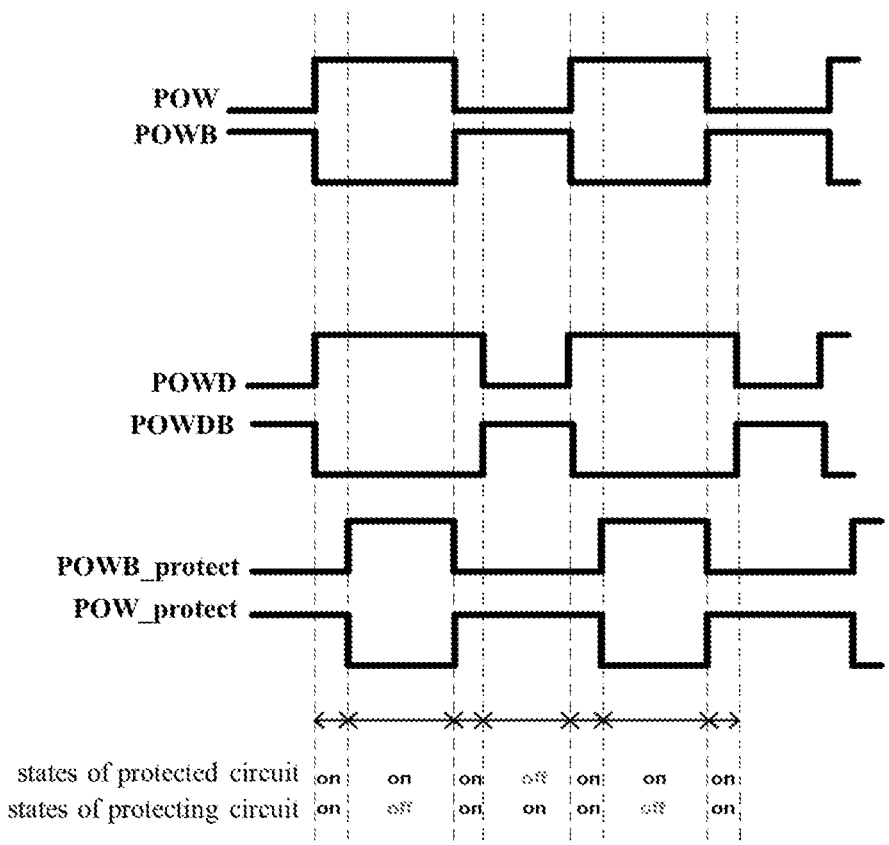
FIG. 6 shows a timing diagram of the signals of FIG. 5 and shows on/off states of the circuits associated with the signals of FIG. 5.

FIG. 1 shows the overvoltage-proof circuit according to an embodiment of the present invention. As shown in FIG. 1, the overvoltage-proof circuit 100 includes a protected circuit 110, a protecting circuit 120 and a control circuit 130. The protected circuit 110 receives a power supply voltage $V_{DD}$ for operation, and includes a protected component and at least one operational switch(es) (as shown in the embodiments of FIG. 2~FIG. 4). The withstanding voltage of the protected component in the protected circuit 110 is lower than the power supply voltage. Generally, a withstanding voltage is an upmost voltage that a protected component can withstand; in other words, a voltage higher than the upmost voltage probably damages the protected component or reduces its service life. The at least one operational switch(es) of the protected circuit 110 is configured to enable or disable the protected circuit 110 according to an enablement signal. At the moments of the protected circuit 110 being enabled or disabled, the protected circuit 110 is likely to receive an overvoltage higher than the withstanding voltage of the above-mentioned protected component, so that the protected circuit 110 needs the protection of the protecting circuit 120. The protecting circuit 120 is coupled to the protected component of the protected circuit 110, and starts operation before a transition of the enablement signal so as to protect the protected component from the damage of the above-mentioned overvoltage in time. The transition of the enablement signal is a transition from the protected circuit 110 being disabled to the protected circuit 110 being enabled (i.e., a transition from the enablement signal being de-asserted to the enablement signal being asserted) and/or a transition from the protected circuit 110 being enabled to the protected circuit 110 being disabled (i.e., a transition from the enablement signal being asserted to the enablement signal being de-asserted). In an exemplary implementation, the protecting circuit 120 starts or stops operation according to a switch signal (as shown by the dotted line of FIG. 1) so as to provide protection during the protecting circuit 120 operating. The switch signal here is dependent upon the enablement signal (as shown in FIG. 6). In another exemplary implementation, the protecting circuit 120 continues operating so as to continuously provide protection; in the meantime, the switch signal is unnecessary, or the switch signal is kept unchanged and unrelated to the enablement signal. The control circuit 130 is configured to generate the enablement signal, and configured to optionally generate the switch signal. An embodiment of the control circuit 130 includes a timing generating circuit (as shown in the embodiment of FIG. 5) or an equivalent thereof.

FIG. 2 shows an embodiment of the protected circuit 110 and the protecting circuit 120 of FIG. 1. As shown in FIG. 2, the protected circuit 110 is a folded cascade operational amplifier (i.e., all the circuits in FIG. 2 except the protecting circuit 120) configured to generate a differential output signal ($V_{OUT+}$, $V_{OUT-}$) according to an differential input signal ($V_{IN+}$, $V_{IN-}$). The protected circuit 110 includes: a pair of transistors 210 (PMOS transistors M1, M2 of FIG. 2) configured to receive the differential input signal; and a plurality of operational switches 220 (PMOS transistors M4, M11, M12 of FIG. 2) configured to receive an enablement signal POWDB to enable or disable the protected circuit 110. In order to enhance performance, the pair of transistors 210 are those having high performance but low withstanding voltage; therefore, the pair of transistors 210 are vulnerable to an overvoltage, so that the pair of transistors 210 should be protected as a protected component. The protecting circuit 120 includes a plurality of transistors (PMOS transistors MP1, MP2 of FIG. 2) coupled between a signal input terminal (gates) and a signal output terminal (drains) of the pair of transistors 210. The protecting circuit 120 starts operation before a transition of the enablement signal POWDB (i.e., the transistors MP1, MP2 of FIG. 2 as protecting switches being turned on before the transition of the enablement signal POWDB), so as to confine the voltage drop of the two terminals of each transistor in the pair of transistors 210; as a result, the pair of transistors 210 are protected from damage caused by an overvoltage. In addition, the protecting circuit 120 is enabled and/or disabled according to the switch signal POWB_protect, and thereby provides protection during the protecting circuit 120 being enabled. The switch signal POWB_protect could be generated by the control circuit 130 of FIG. 5 or an equivalent thereof. Since the control and operation of the other circuits of the folded cascade operational amplifier (i.e., transistors M3, M5~M10, M13~M16 and their connection) are well known in this industrial field, the detail is omitted here.

FIG. 3 shows another embodiment of the protected circuit 110 and the protecting circuit 120 of FIG. 1. In comparison with FIG. 2, the protecting circuit 120 of FIG. 3 further includes a transistor MD1 and a transistor MD2. Both the transistor MD1 and the transistor MD2 are diode-connected transistors as voltage-regulation components. The voltage-regulation components are configured to determine a voltage drop between the signal input terminal (gates) and the signal output terminal (drains) of the pair of transistors 210, so as to ensure that the voltage drop is not greater than a withstanding voltage of any transistor in the pair of transistors 210. In addition, in an exemplary implementation, the protecting circuit 120 of FIG. 3 is enabled or disabled according to the switch signal POWB_protect, and thereby provides protection in the duration of the protecting circuit 120 being enabled. In another exemplary implementation, the protecting circuit 120 of FIG. 3 continuously provides protection according to the switch signal POWB_protect after the protected circuit 110 receives the power supply voltage $V_{DD}$ (i.e., the switch signal POWB_protect remaining the same so as to continuously turn on the transistors MP1, MP2 regardless of whether the protected circuit 110 is enabled); in other words, the protecting circuit 120 will provide protection till the power supply voltage is not supplied while the transistors MP1, MP2 and the switch signal could be omitted in this exemplary implementation.

FIG. 4 shows another embodiment of the protected circuit 110 and the protecting circuit 120 of FIG. 1. As shown in FIG. 4, the protected circuit 110 is a bias circuit (i.e., all the circuit in FIG. 4 except the protecting circuit 120) receiving a bias $V_B$, and includes: a transistor 410 (the PMOS transistor MB2 of FIG. 4 as a protected component); and an operational switch 420 (the NMOS transistor MB4 of FIG. 2) configured to receive an enablement signal POWD, that is equivalent to an inverse signal of the aforementioned enablement signal POWDB, to enable or disable the protected circuit 110. In order to enhance performance, a transistor having high performance but low withstanding voltage is chosen to be the transistor 410, and thus the transistor 410 is vulnerable to an overvoltage; therefore, the transistor 410 should be protected as a protected component. The protecting circuit 120 includes a transistor (the PMOS transistor MP1 of FIG. 4) coupled between the gate and the drain of the transistor 410. The protecting circuit 120 starts operation before a transition of the enablement signal POWD (i.e., the transistor MP1 of FIG. 4 acting as a protecting switch, and being turned on before the transition of the enablement signal POWD), so as to protect the transistor 410 from damage of an overvoltage when the protected circuit 110 is enabled and/or disabled. In addition, the protecting circuit 120 is enabled or disabled in response to the switch signal POWB_protect and thereby provides protection in the duration of the protecting circuit 120 being enabled; in this case, the switch signal POWB_protect could be generated by the control circuit 130 of FIG. 5 or an equivalent thereof. Since the control and operation of the other circuits in the bias circuit of FIG. 4 (i.e., transistors MB1, MB3, MB5, MB6 and their connection) are well known in this industrial field, the detail is omitted here.

It should be noted that in the aforementioned embodiments, each non-protected transistor (e.g., any of the transistors M3, M5~M10 and M13~M16 in FIG. 2 and FIG. 3, or any of the transistors MB1 and MB3~MB6 of FIG. 4) has a withstanding voltage (e.g., a voltage higher than the power supply voltage $V_{DD}$) higher than the withstanding voltage (e.g., a voltage lower than the power supply voltage $V_{DD}$) of the protected component (e.g., the pair of transistors 210 in FIG. 2/FIG. 3, or the transistor MB2 of FIG. 4); however, this is not a restriction on an implementation of the present invention as long as the implementation is practicable. It should also be noted that although in the embodiments of FIG. 2~FIG. 4, the protecting circuit 120 is set between the gate and the drain of the protected component, this is not a limitation in the present invention. The protecting circuit of the present invention could be set between any two terminals of a component/circuit needing protection, so as to have the component/circuit be protected; for instance, when the component needing protection is a transistor, the protecting circuit of the present invention could be set between the drain and the source of the transistor.

FIG. 5 shows an embodiment of the control circuit 130 of FIG. 1. As shown in FIG. 5, the control circuit 130 includes a delay circuit 510, a first logic-gate circuit 520 and a second logic-gate circuit 530. The delay circuit 510 is configured to delay the output of a control signal POW for a predetermined time, and thereby generates a delay signal DS. The first logic-gate circuit 520 includes: an OR gate 522 configured to generate an inverse enablement signal POWD according to the delay signal DS and the control signal POW; and an inverter 524 configured to generate the aforementioned enablement signal POWDB according to the inverse enablement signal POWD. The second logic-gate circuit 530 includes: a NAND gate 532 configured to generate an inverse switch signal POW_protect according to the delay signal DS and the control signal POW; and an inverter 534 configured to generate the switch signal POW-B_protect according to the inverse switch signal POW_protect. The timing diagram of the above-mentioned signals and the on/off states of the protected circuit 110 and the protecting circuit 120 associated with those signals are shown in FIG. 6, in which the signal POWB is an inverse signal of the control signal POW, the label "on" indicates that the state of a circuit is "enabled" while the label "off" indicates that the state of a circuit is "disabled", and the waveform of each signal in FIG. 6 is exemplary rather than restrictive. It should be noted that in some condition (e.g., a condition that the operational switches and/or protecting switches of FIG. 2~FIG. 4 are composed of NMOS transistors) the inverter 524 and/or the inverter 534 of FIG. 5 could be omitted while the enablement signal is the signal POWD and/or the switch signal is the signal POW_protect. It should also be noted that those of ordinary skill in the art can use a known or self-developed circuit equivalent to the control circuit 130 to generate the enablement signal and/or the switch signal; or those of ordinary skill in the art can use another known or self-developed circuit to generate the enablement signal and/or the switch signal as long as this circuit is capable of generating the switch signal enabling the protecting circuit before a transition of the enablement signal.

It should be noted that a person of ordinary skill in the art can derive a practicable implementation from one or several embodiments of the present invention while this implementation may include some or all features in the one embodiment or include the combination of some or all features in the several embodiments. It should also be noted that people who carry out the present invention can choose the type of transistors (e.g., PMOS transistors or NMOS transistors) as the aforementioned operational switch(es) and protecting circuit.

In summary, the overvoltage-proof circuit of the present invention is capable of protecting a component of low withstanding voltage in the overvoltage-proof circuit from an overvoltage generated at moments of an operation starting/stopping. As a result, the overvoltage-proof circuit of the present invention not only achieves better performance with the component of low withstanding voltage, but also ensures the reliability and the service life of the component. Furthermore, the overvoltage-proof circuit of the present invention can be fabricated by a standard CMOS process without worrying the low withstanding voltage of the component.

The aforementioned descriptions represent merely the exemplary embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An overvoltage-proof circuit capable of preventing damage caused by an overvoltage, the overvoltage-proof circuit comprising:
    a protected circuit generating at least one output signal(s) according to at least one input signal(s), the protected circuit receiving a power supply voltage for operation and including:
        a protected component configured to receive the at least one input signal(s); and
        at least one operational switch(es) configured to enable or disable the protected circuit according to an enablement signal; and
    a protecting circuit coupled between a first terminal of the protected circuit and a second terminal of the protected circuit, in which the first terminal is configured to receive the at least one input signal(s), the protecting circuit starts and/or stops operating before a transition of the enablement signal according to a switch signal so as to protect the protected component from the damage caused by the overvoltage which is greater than a withstanding voltage of the protected component.

2. The overvoltage-proof circuit of claim 1, wherein the protected component is a pair of transistors, the first terminal is composed of two gates of the pair of transistors, and the second terminal is composed of two drains or two sources of the pair of transistors.

3. The overvoltage-proof circuit of claim 1, wherein the protecting circuit continuously protects the protected circuit during the power supply voltage being supplied.

4. The overvoltage-proof circuit of claim 1, wherein the protecting circuit includes a protecting switch for enabling or disabling the protecting circuit according to the switch signal so that the protecting circuit is enabled before the transition of the enablement signal.

5. The overvoltage-proof circuit of claim 4, wherein the protecting circuit further includes at least one voltage-regulation component(s) configured to confine a voltage between the first terminal of the protected circuit and the second terminal of the protected circuit.

6. The overvoltage-proof circuit of claim 4, further comprising: a control circuit configured to generate the enablement signal and the switch signal according to a control signal.

7. The overvoltage-proof circuit of claim 6, wherein the control circuit includes:
    a delay circuit configured to generate a delay signal according to the control signal;

a first logic-gate circuit configured to generate the enablement signal according to the delay signal and the control signal; and a second logic-gate circuit, different from the first logic-gate circuit, configured to generate the switch signal according to the delay signal and the control signal.

8. The overvoltage-proof circuit of claim 1, wherein the at least one input signal(s) is a differential input signal composed of a positive-end input signal and a negative-end input signal, the protected component includes a first transistor and a second transistor configured to receive the positive-end signal and the negative-end signal respectively, the protecting circuit includes a first protecting circuit and a second protecting circuit, the first protecting circuit is coupled to a first node between a gate of the first transistor and one of a drain and a source of the first transistor, and the second protecting circuit is coupled to a second node between a gate of the second transistor and one of a drain and a source of the second transistor.

9. The overvoltage-proof circuit of claim 1, wherein the withstanding voltage of the protected component is lower than the power supply voltage.

10. An overvoltage-proof circuit, comprising:
a protected circuit receiving a power supply voltage for operation, the protected circuit including:
   a protected component; and
   at least one operational switch(es) configured to enable or disable the protected circuit according to an enablement signal; and
a protecting circuit coupled to the protected circuit, the protecting circuit starting and/or stopping operating before a transition of the enablement signal according to a switch signal so as to protect the protected component from an overvoltage which is greater than a withstanding voltage of the protected component.

11. The overvoltage-proof circuit of claim 10, wherein the protected component is a pair of transistors, the first terminal is composed of two gates of the pair of transistors, and the second terminal is composed of two drains or two sources of the pair of transistors.

12. The overvoltage-proof circuit of claim 10, wherein the protecting circuit continuously operates in a duration of the power supply voltage being supplied.

13. The overvoltage-proof circuit of claim 10, wherein the protecting circuit includes a protecting switch for enabling or disabling the protecting circuit according to the switch signal which enables the protecting circuit before the transition of the enablement signal.

14. The overvoltage-proof circuit of claim 13, further comprising: a control circuit configured to generate the enablement signal and the switch signal according to a control signal.

15. The overvoltage-proof circuit of claim 13, wherein the protecting circuit further includes at least one voltage-regulation component(s) configured to confine a voltage between a first terminal of the protected circuit and a second terminal of the protected circuit.

16. The overvoltage-proof circuit of claim 10, wherein the withstanding voltage of the protected component is lower than the power supply voltage.

* * * * *